US010121706B2

(12) United States Patent
Lee et al.

(10) Patent No.: US 10,121,706 B2
(45) Date of Patent: Nov. 6, 2018

(54) SEMICONDUCTOR STRUCTURE INCLUDING TWO-DIMENSIONAL AND THREE-DIMENSIONAL BONDING MATERIALS

(71) Applicant: GLOBALFOUNDRIES INC., Grand Cayman (KY)

(72) Inventors: Rinus T. P. Lee, Ballston Spa, NY (US); Bharat V. Krishnan, Mechanicville, NY (US); Hui Zang, Guilderland, NY (US); Matthew W. Stoker, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/361,809

(22) Filed: Nov. 28, 2016

(65) Prior Publication Data

US 2018/0151449 A1    May 31, 2018

(51) Int. Cl.
*H01L 29/06* (2006.01)
*H01L 21/8238* (2006.01)
*H01L 29/32* (2006.01)
*H01L 27/092* (2006.01)

(52) U.S. Cl.
CPC ............... *H01L 21/823821* (2013.01); *H01L 21/823807* (2013.01); *H01L 21/823878* (2013.01); *H01L 27/0924* (2013.01); *H01L 29/0649* (2013.01); *H01L 29/32* (2013.01)

(58) Field of Classification Search
CPC ......... H01L 21/823821; H01L 29/0649; H01L 27/0924; H01L 21/823807
See application file for complete search history.

(56) References Cited

U.S. PATENT DOCUMENTS

| | | | |
|---|---|---|---|
| 9,601,482 B1* | 3/2017 | Fogel | H01L 27/0629 |
| 2013/0099282 A1* | 4/2013 | Chen | H01L 29/66795 257/190 |
| 2013/0288464 A1 | 10/2013 | Wei et al. | |
| 2014/0255705 A1 | 9/2014 | Nepal et al. | |
| 2015/0249127 A1* | 9/2015 | Xie | H01L 29/0692 438/437 |
| 2015/0311337 A1* | 10/2015 | Cai | H01L 29/66795 257/347 |
| 2015/0364578 A1* | 12/2015 | Liu | H01L 29/66795 257/401 |
| 2016/0043225 A1* | 2/2016 | Ching | H01L 29/1054 257/401 |

(Continued)

*Primary Examiner* — Nathan W Ha
(74) *Attorney, Agent, or Firm* — Francois Pagette; Hoffman Warnick LLC

(57) ABSTRACT

One aspect of the disclosure is directed to a method of forming a semiconductor structure. The method including: removing each fin in a set of fins from between insulator pillars to expose a portion of a substrate between each insulator pillar, the substrate having a first device region and a second device region; forming a first material over the exposed portions of the substrate between each insulator pillar, the first material including a two-dimensional material; forming a second material over the first material in the first device region, the second material including a first three-dimensional bonding material; and forming a third material over the exposed first material in the second device region, the third material including a second three-dimensional bonding material.

9 Claims, 4 Drawing Sheets

(56) References Cited

U.S. PATENT DOCUMENTS

| | | | |
|---|---|---|---|
| 2016/0141373 A1* | 5/2016 | Cantoro | H01L 29/267 257/27 |
| 2016/0149030 A1* | 5/2016 | Kim | H01L 29/7816 257/337 |
| 2016/0197079 A1* | 7/2016 | Lin | H01L 27/0922 257/369 |
| 2016/0225676 A1* | 8/2016 | Jacob | H01L 21/845 |
| 2016/0293600 A1* | 10/2016 | You | H01L 27/0886 |
| 2016/0315147 A1* | 10/2016 | Leobandung | H01L 27/0886 |
| 2016/0343585 A1* | 11/2016 | Basker | H01L 27/0924 |
| 2016/0365253 A1* | 12/2016 | Chen | G06F 17/5068 |
| 2017/0062592 A1* | 3/2017 | Basker | H01L 27/0924 |
| 2017/0117413 A1* | 4/2017 | Hashemi | H01L 29/7849 |
| 2017/0278928 A1* | 9/2017 | Tung | H01L 29/1054 |
| 2017/0317180 A1* | 11/2017 | Chuang | H01L 29/785 |

\* cited by examiner

SEMICONDUCTOR STRUCTURE INCLUDING TWO-DIMENSIONAL AND THREE-DIMENSIONAL BONDING MATERIALS

BACKGROUND

Technical Field

The present disclosure relates to semiconductor structures, and more particularly to semiconductor structures having a two-dimensional material between a substrate and a three-dimensional bonding material.

Related Art

As complementary metal-oxide semiconductor (CMOS) technologies continue to scale down in size, creating smaller semiconductor structures has become more challenging. As a result, alternate semiconductor materials, such as silicon germanium or III-V semiconductors, are being considered as options for advanced technology nodes. One particular challenge related to advanced technology nodes is forming these alternative semiconductor materials directly on a substrate. In particular, due to the lattice mismatch between these semiconductor materials and the substrate, the semiconductor materials may become highly strained as they are grown on the substrate. To overcome this high strain, the semiconductor materials are grown to be very thick, i.e., about 1 micrometer (m) to 2 μm, to allow relaxation of the alternate semiconductor materials near the substrate. Additionally, the lattice mismatch causes defects to form at an interface of the substrate and the semiconductor material grown thereon. Therefore, the semiconductor material must also be grown to a thickness such that the defects terminate, causing at least a portion of the semiconductor material over the defects to be defect free.

Aspect ratio trapping (ART) refers to a process by which defects are trapped within trenches within non-crystalline material. ART has been employed to reduce the thickness of the semiconductor material grown on a substrate. ART includes forming a non-crystalline material on substrate and etching trenches within the non-crystalline material. Subsequently, semiconductor material may be formed within the trenches over the substrate. As previously discussed, defects may form between the semiconductor material and substrate. However, since the semiconductor material is formed within the trenches within the non-crystalline material, the defects will terminate at a surface of the non-crystalline material. That is, the defects will be reduced due to earlier termination within the trenches created during the ART process. Conventional ART processes result in the termination of defects only across or perpendicular to the trench, and not along or parallel with the trench.

SUMMARY

A first aspect of the disclosure is directed to a method of forming a semiconductor structure. The method including: removing each fin in a set of fins from between insulator pillars to expose a portion of a substrate between each insulator pillar, the substrate having a first device region and a second device region; forming a first material over the exposed portions of the substrate between each insulator pillar, the first material including a two-dimensional material; forming a second material over the first material in the first device region, the second material including a first three-dimensional bonding material; and forming a third material over the exposed first material in the second device region, the third material including a second three-dimensional bonding material.

A second aspect of the disclosure is directed to a semiconductor structure. The semiconductor structure may include: a set of fins over a substrate, each fin in the set of fins including: a two-dimensional material over the substrate and a three-dimensional bonding material over the two-dimensional material.

A third aspect of the disclosure is related to a semiconductor structure. The semiconductor structure may include: a first device region and a second device region over a substrate; wherein the first device region includes: a first set of fins on the substrate, each fin in the first set of fins being separated from an adjacent fin in the first set of fins by an insulator pillar in a set of insulator pillars, and each fin in the first set of fins including a two-dimensional material over the substrate and a first three-dimensional bonding material over the two-dimensional material, and wherein the second device region includes: a second set of fins on the substrate, each fin in the second set of fins being separated from an adjacent fin in the second set of fins by an insulator pillar, and each fin in the second set of fins including the two-dimensional material over the substrate and a second three-dimensional bonding material over the two-dimensional material.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to semiconductor structures, and more particularly to semiconductor structures having a two-dimensional material between a substrate and a three-dimensional bonding material. In contrast to conventional semiconductor structures, embodiments of the disclosure provide for an aspect ratio trapping process including a two-dimensional material between a substrate and a three-dimensional bonding material where the three-dimensional bonding material and the substrate have distinct lattices. In this way, the two-dimensional material acts as a relief layer to accommodate the lattice mismatch of the three-dimensional bonding material formed over the substrate thereby creating a defect-free semiconductor structure.

Figure 1:
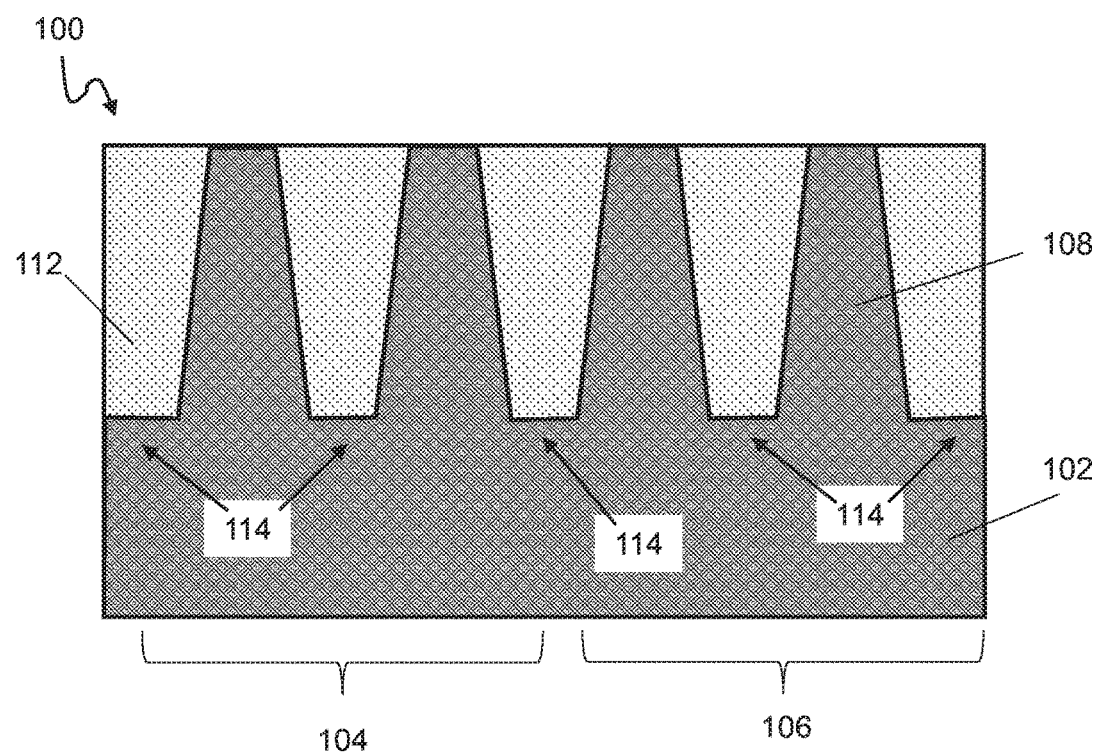
FIG. 1 shows a cross-sectional view of a preliminary semiconductor structure according to embodiments of the disclosure.

FIG. 1 shows a preliminary semiconductor structure 100 including a semiconductor substrate 102 upon which fabrication of active devices according to embodiments of the disclosure will be fabricated. Semiconductor substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B+B2=1 (1 being a total mole quantity). Furthermore, a portion or entire semiconductor substrate 102 may be strained. While substrate 102 includes a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer. The semiconductor layers of SOI substrate may include any of the semiconductor substrate materials discussed herein. The insulator layer of the SOI substrate may include any now known or later developed SOI substrate insulator such as but not limited to silicon oxide.

Substrate 102 may include a first device region 104 and a second device region 106. Device regions 104, 106 may define regions in which active devices, e.g., transistors, may be formed as known in the art. Device regions 104, 106 may be adjacent to one another over or within substrate 102. Device regions 104, 106 may be separated from one another by conventional shallow trench isolation regions. One or more (or a set of) semiconductor fins 108 may be patterned, e.g., with a mask in place, and etched from substrate 102. Where substrate 102 includes an SOI substrate, fins 108 may be patterned and etched from the uppermost semiconductor layer. As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Still referring to FIG. 1, an insulator material 112 may be formed, e.g., deposited, over substrate 102 and fins 108. Insulator material 112 may further be planarized to a top surface of fins 108 such that the top surface of fins 108 are exposed to form insulator pillars 114. As shown in FIG. 1, fins 108 may be separated from adjacent fins 108 by insulator pillars 114 such that each fin 108 is positioned laterally between adjacent insulator pillars 114. Insulator material 112 may include, for example, at least one of: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. As used herein, "depositing," "deposition," etc., may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 2:
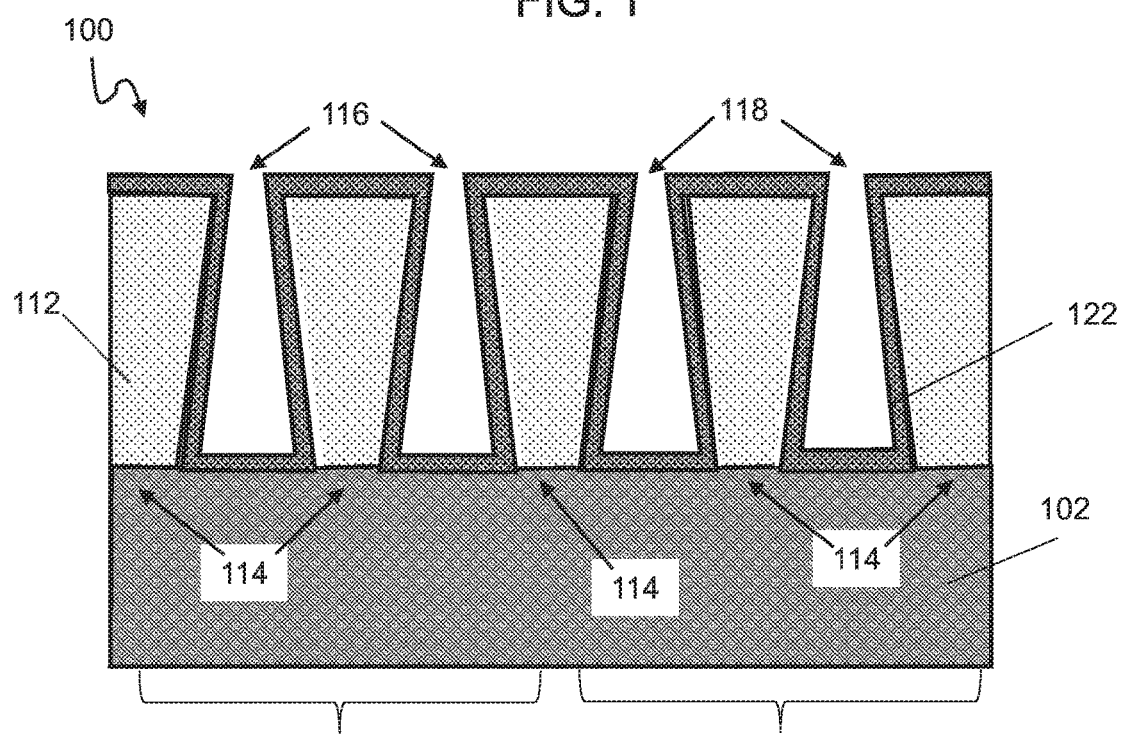
FIG. 2-7 show a cross-sectional view of the semiconductor structure undergoing aspects of a method according to embodiments of the disclosure.
Figure 8:
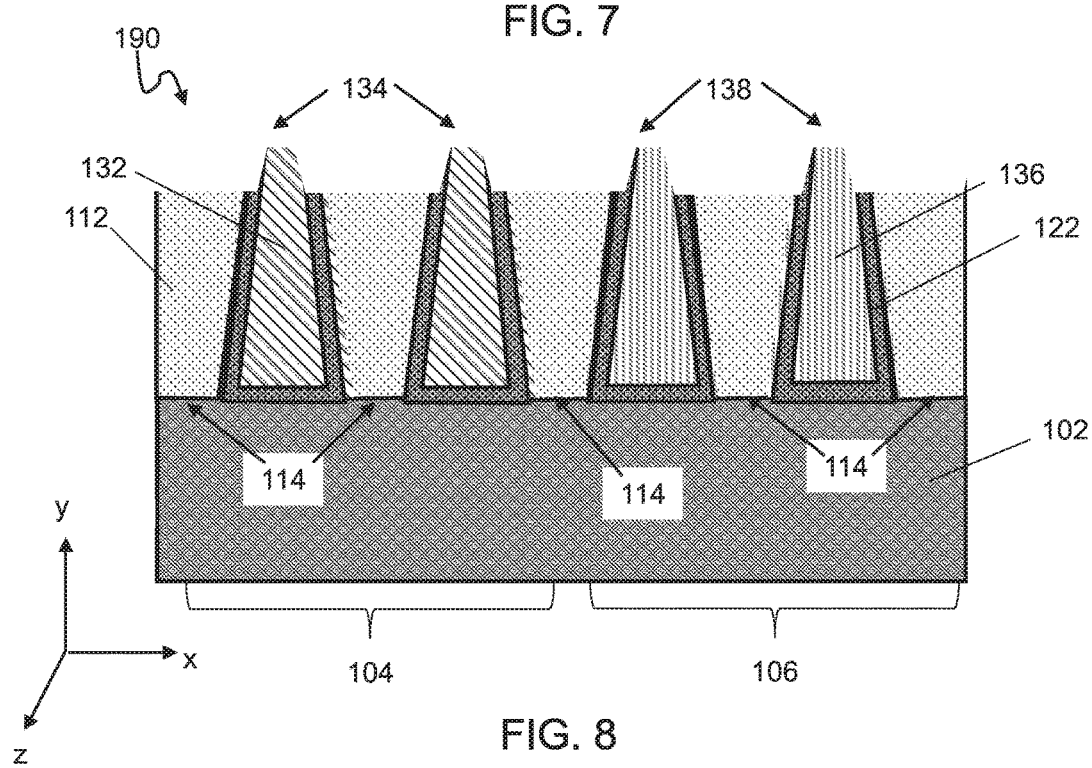
FIG. 8 shows a cross-sectional view of a resulting semiconductor structure according to embodiments of the disclosure.

Turning now to FIG. 2, semiconductor structure 100 is shown wherein fins 108 (FIG. 1) have been removed. That is, each fin 108 may be removed from between insulator pillars 114 to expose a portion of substrate 102 between each insulator pillar 114. Fins 108 may be removed by conventional etching to create openings 116 in device region 104 and openings 118 in device region 106 to expose portions of substrate 102. Further, a two-dimensional material 122 may be formed, e.g., deposited, within openings 116, 118 over the exposed portions of substrate 102 within each device region 104, 106. Additionally, two dimensional material 122 may be formed over insulator pillars 114 between openings 116, 118. As used herein, "two-dimensional material" may refer to a material having two-dimensional bonding orientations, such as bonding with Van Der Waals forces and/or be a material capable of existing as a free-standing layer bonding in the x-direction and y-direction (FIG. 8). Two-dimensional material 122 may include, for example, at least one of: molybdenum disulfide, tungsten diselenide, boron phosphide, hafnium diselenide, black phosphorus, phosporene, germanane, hafnium disulphide, or graphene. However, it is to be understood that two-dimensional material 122 is not limited to the two-dimensional materials discussed herein, and may include any now known or later developed two-dimensional materials.

Figure 3:
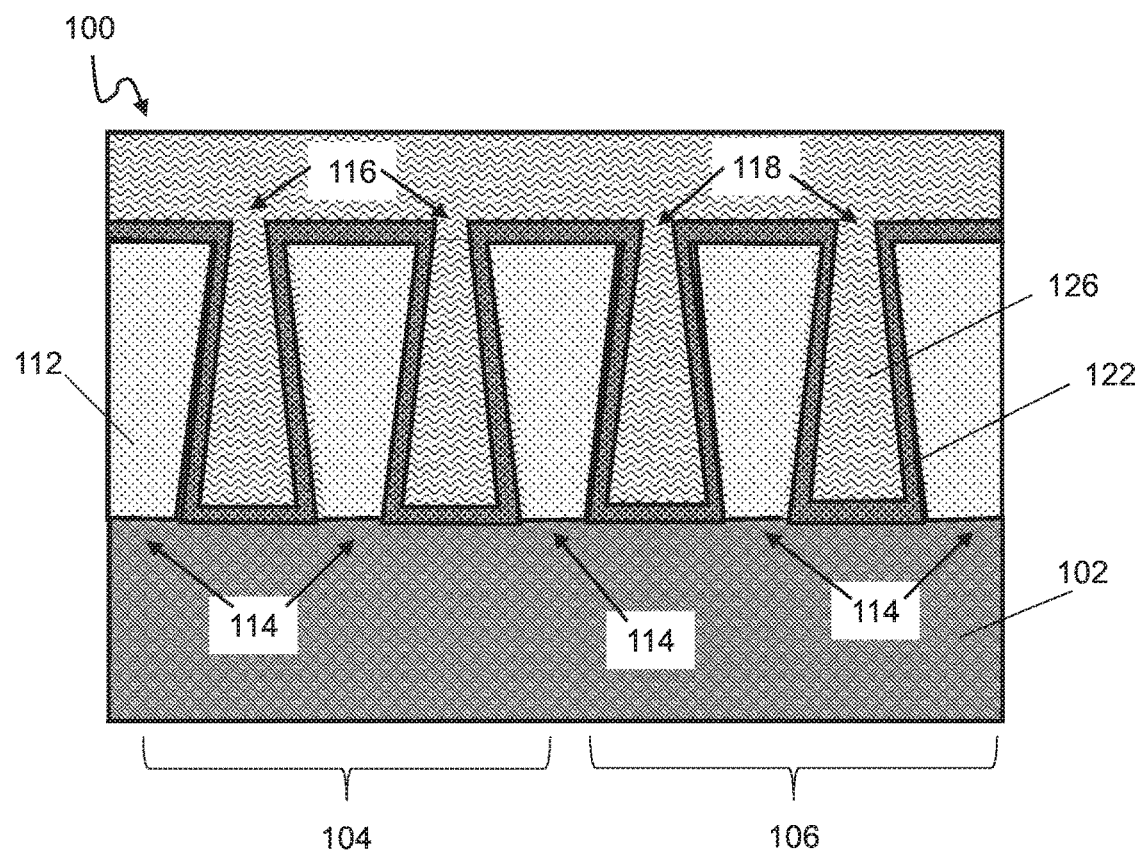
Figure 4:
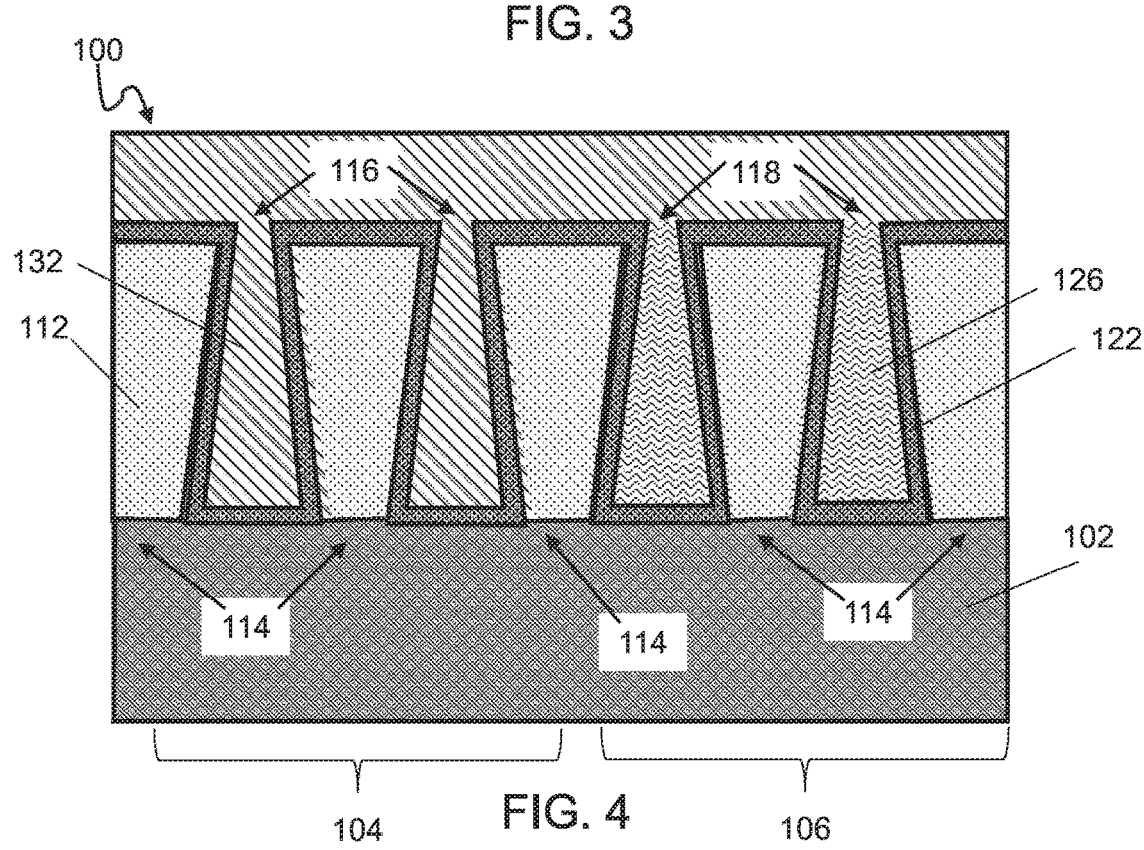

As shown in FIG. 3, a sacrificial insulator 126 may be formed, e.g., deposited, over two-dimensional material 122 within each opening 116, 118 in each device region 104, 106 and over insulator pillars 114 between openings 116, 118. Sacrificial insulator 126 may include, for example, an oxide or other insulator layer material discussed herein. Turning now to FIG. 4, sacrificial insulator 126 may be planarized to a top surface of two-dimensional material 122.

Additionally, sacrificial insulator 126 may be removed, e.g., by conventional masking and etching techniques, from openings 116 in device region 104 to expose two-dimensional material 122 in openings 116 using conventional masking and etching techniques. Sacrificial insulator 126 may be removed such that sacrificial insulator 126 remains within openings 118 in device region 106.

Still referring to FIG. 4, a three-dimensional bonding material 132 may be formed, e.g., deposited, over two-dimensional material 122 within openings 116 in device region 104 and over sacrificial insulator 126 within openings 118. As used herein, "three-dimensional bonding material" refers to a material having three-dimensional bonding orientations, such as ionic or covalent bonding, and/or be a material capable of existing as a free-standing layer bonding in the x-direction, y-direction, and z-direction (FIG. 8). That is, three-dimensional bonding material 132 may be a material that differs from two-dimensional material 122 in its lattice orientation, e.g., three-dimensional bonding material 132 and two-dimensional material 122 are lattice mismatched. Three-dimensional bonding material 132 may include a III-V semiconductor material, such as for example, at least one of: gallium arsenide, gallium phosphide, gallium antimonide, gallium nitride, indium arsenide, indium phosphide, indium antimonide, indium nitride, aluminum arsenide, aluminum phosphide, aluminum antimonide, aluminum nitride, and/or their ternary or quaternary compounds. In some embodiments, three-dimensional bonding material 132 may include silicon, silicon-germanium, germanium, germanium-tin, or combinations thereof. More specifically, where device region 104 includes an n-type field-effect-transistor (nFET), three-dimensional bonding material 132 may include at least one of: indium, gallium, arsenide, nitride, silicon, silicon germanium, germanium, germanium tin, or combinations thereof (e.g., gallium nitride, gallium arsenide, indium gallium arsenide, etc.). Where device region 104 includes a p-type field-effect-transistor (pFET), three-dimensional bonding material 132 may include at least one of: indium, antimonide, silicon, silicon-germanium, germanium and germanium-tin, or combinations thereof (e.g., indium antimonide).

However, it is to be understood that three-dimensional bonding material 132 is not limited to the three-dimensional bonding materials discussed herein, and may include any now known or later developed three-dimensional bonding materials. Three-dimensional bonding material 132 may have a lattice that is distinct from or does not match a lattice of substrate 102. Three-dimensional bonding material 132 may be deposited over substrate 102 with little or no defects in either the x-direction (FIG. 8) or the y-direction (FIG. 8) due to two-dimensional material therebetween.

Figure 5:
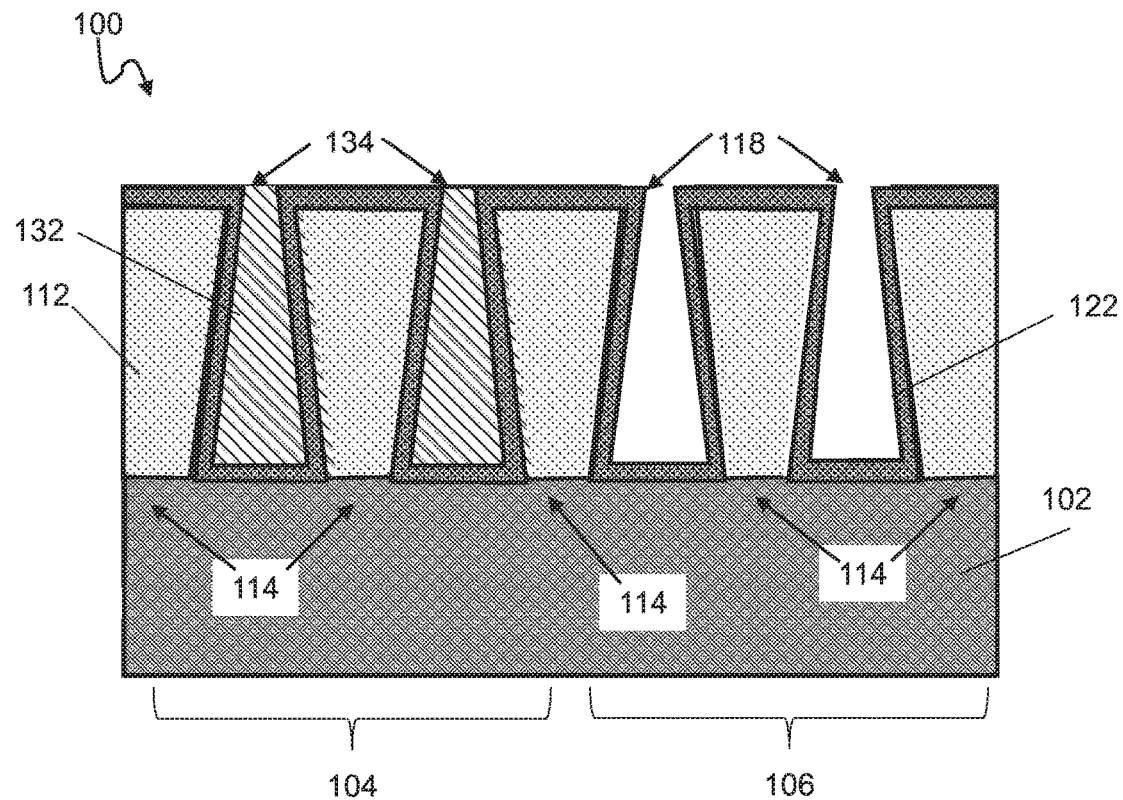
Figure 6:
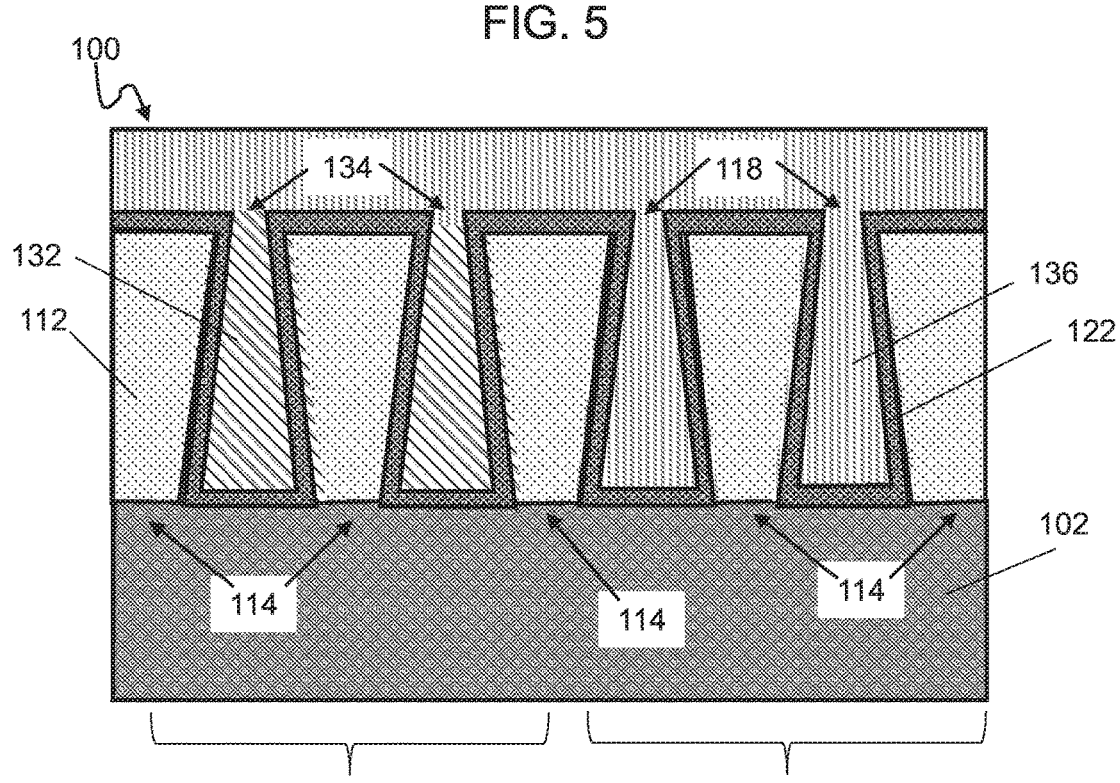

As shown in FIG. 5, three-dimensional bonding material 132 may be planarized to a top surface of two-dimensional material 122 to create (a set of) fins 134 in device region 104. Fins 134 may be separated from adjacent fins 134 by insulator pillars 114. Such planarization may expose sacrificial insulator 126 (FIG. 4) within openings 118 in device region 106. The exposed sacrificial insulator 126 may be removed, e.g., by conventional masking and etching techniques, from openings 118 in device region 106 to expose two-dimensional material 122 within openings 118 in device region 106. Turning now to FIG. 6, another three-dimensional bonding material 136 may be formed, e.g., deposited, within openings 118 in device region 106 and over fins 134 in device region 104. Three-dimensional bonding material 136 may be a material that differs from two-dimensional material 122 in its lattice orientation, or three-dimensional bonding material 136 and two-dimensional material 122 are lattice mismatched. Three-dimensional bonding material 136 may include a III-V semiconductor material, such as for example, at least one of: gallium arsenide, gallium phosphide, gallium antimonide, gallium nitride, indium arsenide, indium phosphide, indium antimonide, indium nitride, aluminum arsenide, aluminum phosphide, aluminum antimonide, aluminum nitride, and/or their ternary or quaternary compounds. In additional embodiments, three-dimensional bonding material 136 may include silicon, silicon-germanium, germanium, germanium tin, or combinations thereof. More specifically, where device region 106 includes an nFET, three-dimensional bonding material 136 may include at least one of: indium, gallium, arsenide, nitride, silicon, silicon germanium, germanium, germanium tin, or combinations thereof (e.g., gallium nitride, gallium arsenide, indium gallium arsenide, etc.). Where device region 106 includes a pFET, three-dimensional bonding material 136 may include at least one of: indium, antimonide, silicon, silicon-germanium, germanium and germanium-tin, or combinations thereof (e.g., indium antimonide).

However, it is to be understood that three-dimensional bonding material 132 is not limited to the three-dimensional bonding materials discussed herein, and may include any now known or later developed three-dimensional bonding materials. Three-dimensional bonding material 136 may have a lattice that is distinct from or does not match a lattice of substrate 102. Three-dimensional bonding material 136 may be deposited over substrate 102 with little or no defects in either the x-direction (FIG. 8) or the y-direction (FIG. 8) due to two-dimensional material therebetween. In some cases, device region 104 may include a pFET or an nFET and device region 106 may include the opposite one of the pFET or the nFET. In other cases, device regions 104, 106 may each include a pFET. In yet another case, device regions 104, 106 may each include an nFET.

Figure 7:
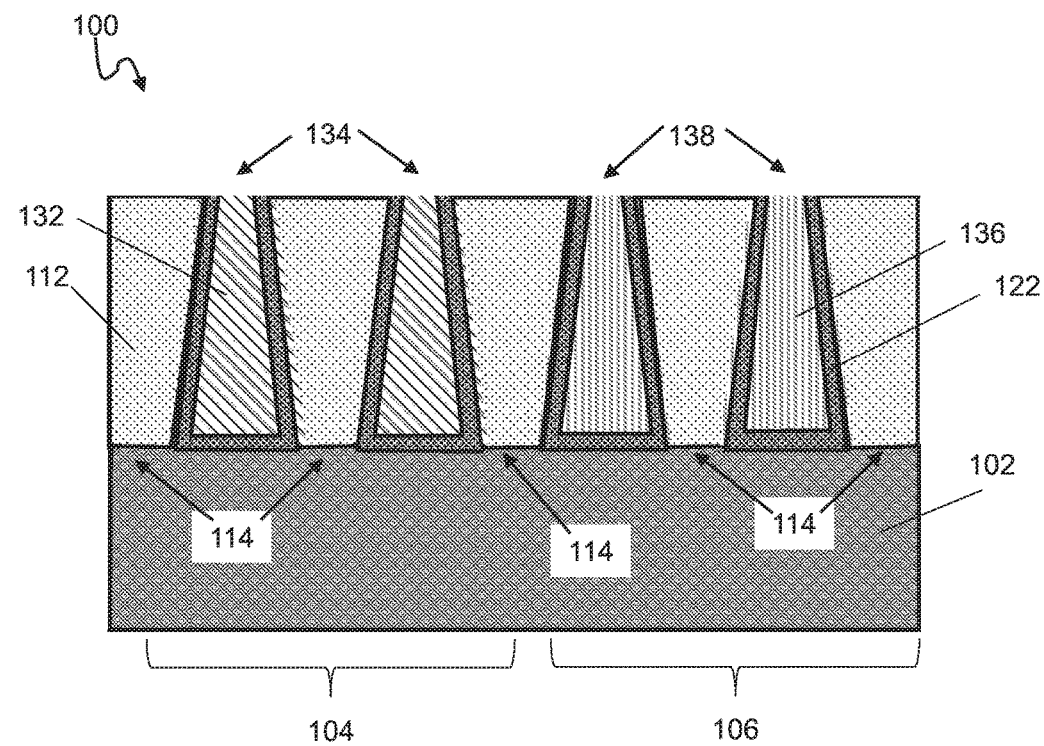

As shown in FIG. 7, three-dimensional bonding material 136 and two-dimensional material 122 may be planarized to a top surface of insulator pillars 114 to form a set of fins 138 in device region 106 and to expose insulator pillars 114. Fins 138 may be separated from adjacent fins by insulator pillars 114. Additionally, as shown in FIG. 8, insulator pillars 114 and two-dimensional material 122 may each be recessed, e.g., via etching, such that three-dimensional bonding materials 132, 136 in each device region 116, 118 have a height greater than a height of insulator pillars 112 and two-dimensional material 122 or such that an uppermost portion of three-dimensional bonding materials 132, 136 is exposed. While it is not shown herein, resulting semiconductor structure 190 may undergo additional processing that is known in the art, such as to form active devices, e.g., transistors, fin-shaped field effect transistors, etc.

Resulting semiconductor structure 190 may include set of fins 134, 138 over substrate 102 wherein each fin 134, 138 includes two-dimensional material 122 over substrate 102 and three-dimensional bonding material 132, 136 over two-dimensional material 122. More specifically, resulting semiconductor structure 190 may include set of fins 134 on substrate 102 in device region 104. Each fin 134 may be separated from an adjacent fin 134 by insulator pillars 114. Each fin 134 may include two-dimensional material 122 over substrate 102 and three-dimensional bonding material 132 over two-dimensional material 122. Additionally, resulting semiconductor structure 190 may include set of fins 138 on substrate 102 in device region 106. Each fin 138 may be separated from an adjacent fin 138 by insulator pillars 114. Each fin 138 may include two-dimensional material 122 over substrate 102 and three-dimensional bonding material 136 over two-dimensional material 122. Two-dimensional material 122 may include, for example, at least one of: molybdenum disulfide, tungsten diselenide, boron phosphide, hafnium diselenide, black phosphorus, phosporene, germanane, hafnium disulphide, or graphene. Three-dimensional bonding materials 132, 136 may include, for example, at least one of: indium, gallium, arsenide, antimonide, nitride, silicon, silicon-germanium, germanium and germanium-tin, or combinations thereof. An uppermost portion of three-dimensional bonding materials 132, 136 may be exposed. That is, three-dimensional bonding materials may have a height that is greater than insulator pillars 114, or extend above a top surface of insulator pillars 114.

Three-dimensional bonding materials 132, 136 may each have a lattice that is distinct from or does not match a lattice of substrate 102. In contrast to conventional semiconductor structures, two-dimensional material described herein acts as a relief layer to accommodate the lattice mismatch of three-dimensional bonding materials 132, 136 formed over substrate 102. As such, embodiments described herein provide for a new method and structure having little or no defects across or perpendicular to openings 116, 118 (FIG. 5), i.e., in the x-direction as shown in FIG. 8, and along or parallel with openings 116, 118 (FIG. 5), i.e., in the y-direction as shown in FIG. 8, in contrast to conventional semiconductor structures.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor structure comprising:
   a set of fins over a substrate, each fin in the set of fins comprising a three-dimensional bonding material;
   an insulator pillar on the substrate between each fin in the set of fins; and
   a two dimensional material layer positioned directly between the three-dimensional bonding material and the substrate, and between the three-dimensional bonding material and each insulator pillar.

2. The semiconductor structure of claim 1, wherein the two-dimensional material includes at least one of: molybdenum disulfide, tungsten diselenide, boron phosphide, hafnium diselenide, black phosphorus, phosporene, germanane, hafnium disulphide, or graphene.

3. The semiconductor structure of claim 1, wherein the semiconductor structure is a n-type field effect transistor, and
   wherein the three-dimensional bonding material includes at least one of: silicon, silicon germanium, germanium, germanium tin, indium, gallium, arsenide, nitride, or combinations thereof.

4. The semiconductor structure of claim 1, wherein the semiconductor structure is a p-type field effect transistor, and
   wherein the three-dimensional bonding material includes at least one of: silicon, silicon germanium, germanium, and germanium tin, indium, antimonide, or combinations thereof.

5. The semiconductor structure of claim 1, wherein the three-dimensional bonding material includes a material having a lattice that does not match a lattice of the substrate.

6. A semiconductor structure comprising:

a first device region and a second device region over a substrate;

wherein the first device region includes:

a first set of fins over the substrate, each fin in the first set of fins being separated from an adjacent fin in the first set of fins by an insulator pillar in a set of insulator pillars, and each fin in the first set of fins comprising a first three-dimensional bonding material, and wherein the second device region includes:

a second set of fins on the substrate, each fin in the second set of fins being separated from an adjacent fin in the second set of fins by another insulator pillar in the set of insulator pillars, and each fin in the second set of fins comprising a second three-dimensional bonding material; and a two-dimensional material layer directly between the substrate and the first three-dimensional bonding material, between the insulator pillar and the first three-dimensional bonding material, between the substrate and the second three-dimensional bonding material, and between the another insulator pillar and the second three-dimensional bonding material.

7. The semiconductor structure of claim 6, wherein the two-dimensional material includes at least one of: molybdenum disulfide, tungsten diselenide, boron phosphide, hafnium diselenide, black phosphorus, phosporene, germanane, hafnium disulphide, or graphene.

8. The semiconductor structure of claim 6, wherein the first device region includes a n-type field effect transistor (nFET) and the second device region includes an p-type field effect transistor (pFET), and wherein the first three-dimensional bonding material includes at least one of: silicon, silicon germanium, germanium, germanium tin, indium, gallium, arsenide, nitride, or combinations thereof, and the second three-dimensional bonding material includes at least one of: silicon, silicon germanium, germanium, and germanium tin, indium, antimonide, or combinations thereof.

9. The semiconductor structure of claim 6, wherein the first and second three-dimensional bonding materials each include a material having a lattice that does not match a lattice of the substrate.

* * * * *